United States Patent
Butler et al.

(10) Patent No.: US 6,647,081 B2
(45) Date of Patent: Nov. 11, 2003

(54) PHASE-LOCKED LOOP (PLL) CIRCUIT FOR SELECTIVELY CORRECTING CLOCK SKEW IN DIFFERENT MODES

(75) Inventors: Jim Butler, Sierra Madre, CA (US); Raul Oteyza, Lakewood, CA (US)

(73) Assignee: Emulex Corporation, Costa Mesa, CA (US)

( * ) Notice: Subject to any disclaimer, the term of this patent is extended or adjusted under 35 U.S.C. 154(b) by 0 days.

(21) Appl. No.: 10/161,922

(22) Filed: Jun. 3, 2002

(65) Prior Publication Data

US 2003/0108138 A1 Jun. 12, 2003

Related U.S. Application Data

(60) Provisional application No. 60/340,544, filed on Dec. 12, 2001.

(51) Int. Cl.$^7$ ................................................. H03D 3/24
(52) U.S. Cl. ........................................ 375/376; 375/373
(58) Field of Search ................................ 375/376, 373, 375/375, 294, 327; 329/235; 327/147, 156

(56) References Cited

U.S. PATENT DOCUMENTS 6,014,048 A * 1/2000 Talaga et al. ................ 327/156

* cited by examiner

*Primary Examiner*—Khai Tran
(74) *Attorney, Agent, or Firm*—Fish & Richardson P.C.

(57) ABSTRACT

A phase-locked loop (PLL) circuit includes multiple selectable feedback paths and a mode selector for selecting different feedback paths in different operating modes. The PLL circuit may correct for clock skew or produce a desired degree of clock skew between input and output clock signals in different operating modes.

10 Claims, 2 Drawing Sheets

PHASE-LOCKED LOOP (PLL) CIRCUIT FOR SELECTIVELY CORRECTING CLOCK SKEW IN DIFFERENT MODES

CROSS-REFERENCE TO RELATED APPLICATIONS

This application claims priority to U.S. Provisional Patent Application Ser. No. 60/340,544, filed on Dec. 12, 2001

BACKGROUND

Phase Locked Loop (PLL) circuits may be used for frequency control. PLL circuits may be configured as frequency multipliers, demodulators, tracking generators or clock recovery circuits. A PLL circuit operates by producing an oscillator frequency to match the frequency of an input signal. In the locked condition, any slight change in the input signal first appears as a change in phase between the input signal and the oscillator frequency. This phase shift acts as an error signal to change the frequency of the local PLL oscillator to match the change in the input signal.

A clock signal transmitted from a clock generation circuit to another, downstream clock generation circuit may incur delays as it passes through circuit components in its path. These delays may produce an offset, or skew, between the signals output from the two clock generation circuits. A PLL circuit may be used to reduce this skew.

SUMMARY

A phase-locked loop (PLL) circuit including multiple selectable feedback paths may be used to correct for clock skew between an external clock signal and an internal clock signal in an operating mode. The clock skew may be caused, at least in part, by a delay-inducing element in the clock signal path. In this operating mode, a mode selector may select a feedback path including the clock tree so that the PLL circuit corrects for the delay caused by the clock tree.

The mode selector may select another feedback path in another operating mode in which a certain amount of skew is desirable for that mode's clocking scheme. The selected feedback path may include additional delay—inducing elements such as string of buffers which introduce additional delay into the PLL feedback path. The additional delay may cause the PLL circuit to overcorrect for the skew introduced by the clock tree, thereby producing the desired clock skew between the external and internal clock signals.

DETAILED DESCRIPTION

Figure 1:
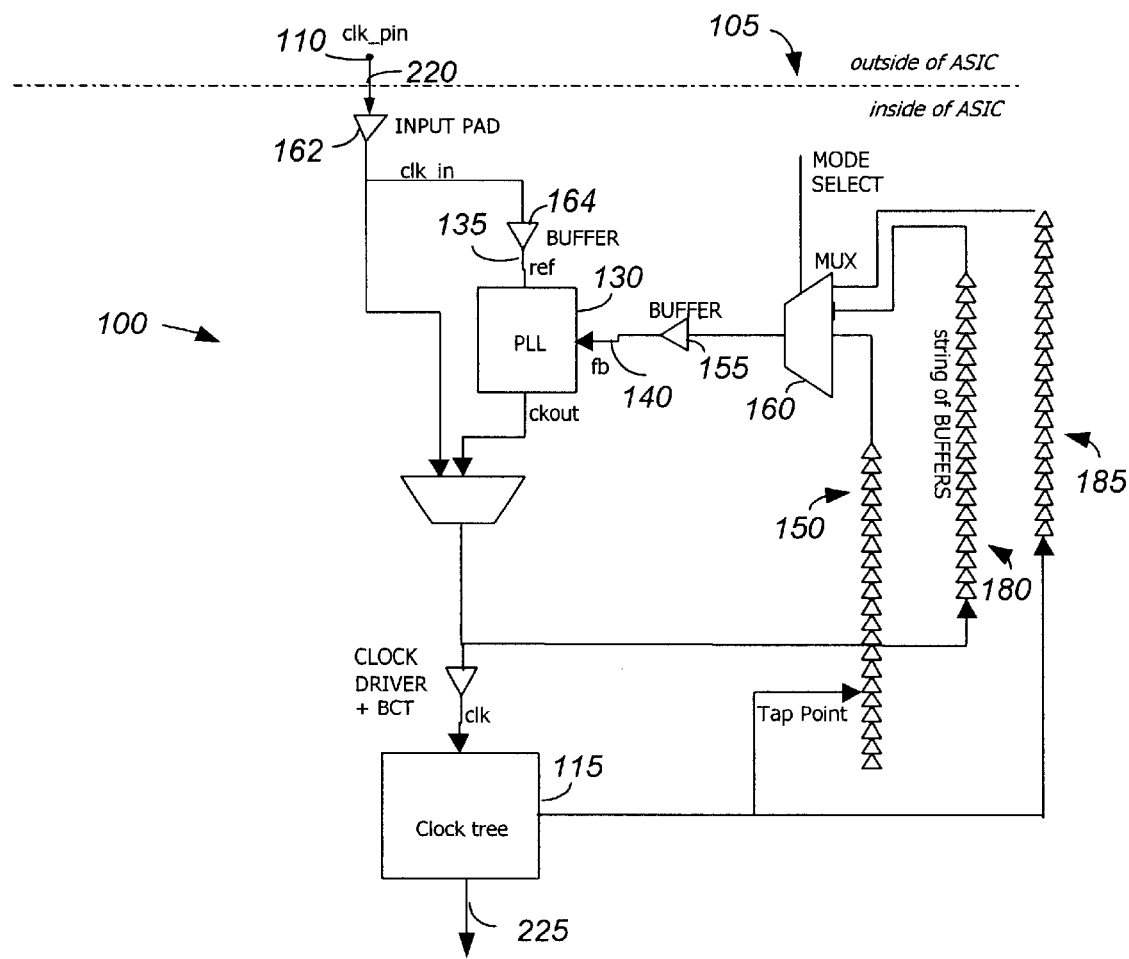
FIG. 1 is a block diagram of a PLL circuit in a device.
Figure 2:
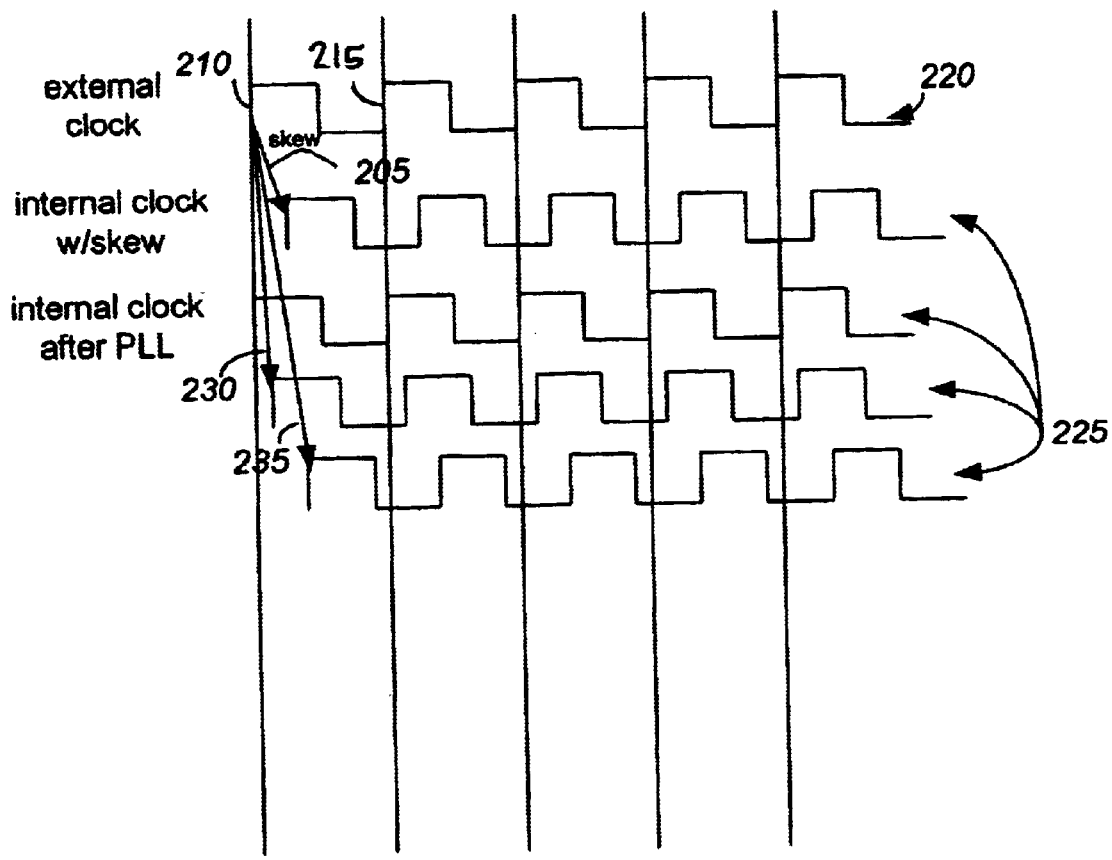
FIG. 2 is a timing diagram illustrating the relationship between an external clock signal entering the device and an internal clock signal generated in the device in different operating modes.

FIG. 1 illustrates a phase-locked loop (PLL) circuit 100 according to an embodiment. The PLL circuit may be used to eliminate clock skew that occurs in a device 105, e.g., an ASIC (Application Specific Integrated Circuit), when an external clock signal, e.g., a system clock, enters the pin 110 of the ASIC 105 and traverses through a series of buffers (e.g., flip-flops) in a clock tree 115. The buffers in the clock tree 115 incur delays, which may produce a skew 205 between the external clock rising edge 210 and the internal clock rising edge 215, as shown in FIG. 2. The effect of the skewed behavior includes a reduced input/output (I/O) timing budget when signals generated by the ASIC 105 use the internal clock to generate signals that must be sampled by the external clock edge outside of the chip.

The external clock signal 220 is input to the pin 110. The signal 135 entering the PLL 130 serves as a reference signal. The PLL 130 corrects for skew between the input signal 135 and a feedback signal 140. This skew may be caused by delays introduced in a feedback path. One source of delay is the buffers in the clock tree 115. The signal from the buffer with the greatest delay may be tapped and fed back to the PLL 130.

The device 105 may operate in different modes with different timing requirements. For example, the device 105 may communicate with external devices over different types of bus interfaces. The device 105 may operate in a PCI (Peripheral Component Interface—Conventional) mode and a PCI-X (PCI Enhanced) mode, which may have different clocking schemes. In one mode, it may be desirable to eliminate clock skew between the external and internal clock signals. However, in certain modes, it may be desirable to introduce a certain amount of skew between the external and internal clock signals. The PLL circuit 100 may include additional feedback paths, which may eliminate skew or produce desired degrees of skew between the external and internal clock signals. The different feedback paths may be selected by providing a mode select signal to a multiplexer 160.

Introducing additional delay in the feedback path may cause the PLL 130 to overcorrect for the skew produced by the clock tree 115. The amount of additional delay, and hence, the degree of overcorrection and skew, may be controlled by adding a string of buffers in the feedback path.

The external clock signal 220 may pass through an input pad 162 and an input buffer 164 before entering the PLL 130. These components may introduce delays, resulting in a skew 205 between the external clock signal and the input signal 135. The feedback path including the string of buffers 150 may be used to eliminate skew between the external clock signal 220 and the internal clock signal 225. The signal from the buffer in the clock tree with the greatest offset from the input signal, i.e., the worst buffer, may be tapped and sent to the PLL 130 to correct for the delay introduced by the clock tree 115.

An additional delay may be introduced into the feedback path by buffers in the string 150 and the feedback buffer 155 to account for the skew between the external clock signal 220 and the input signal 225 caused by delays introduced to the input signal by the input pad 162 and the input buffer 164. The additional buffers may cause the PLL 130 to overcorrect for skew between the input signal 135 and the feedback signal 140 to a degree that negates the delay introduced by the input pad 162 and the input buffer 164. Thus, in this mode, the PLL circuit 100 corrects for skew 205 between the external clock signal 220 and the internal clock signal 225 from the internal clock, as shown in FIG. 2.

In the feedback path including the string of buffers 180, the clock tree 115 may be bypassed, and hence, not contribute to the delay in the feedback signal 140. The number of buffers in the string 180 may be selected to introduce a delay that produces a desired skew 230 between the external clock signal 220 and the internal clock signal 225.

In the feedback path including the string of buffers 185, the feedback signal may be tapped from a buffer in the clock tree 115, and then fed into the string of buffers 185. The tapped buffer and the number of buffers in the string 180 may be selected so that the delay introduced by these components causes the circuit to produce another desired skew 235 between the external clock signal 220 and the internal clock signal 225.

A number of embodiments have been described. Nevertheless, it will be understood that various modifications may be made without departing from the spirit and scope of the invention. Accordingly, other embodiments are within the scope of the following claims.

What is claimed is:

1. Apparatus comprising:

an input node operative to receive a first clock signal;

an output node operative to receive a second clock signal;

a phase-locked loop circuit including a first feedback path and a second feedback path, each of said feedback paths operative to introduce a different degree of skew between the first clock signal and the second clock signal;

a feedback path selector operative to select one of said feedback paths; and a clock signal path between the input node and the output node, the clock signal path comprising a first delay-inducing element, wherein the second feedback path comprises said first delay-inducing element and one or more additional delay-inducing elements operative to overcorrect for a skew between said input signal and said output signal caused by the first delay-inducing element.

2. The apparatus of claim 1, wherein the first feedback path is operative to introduce substantially no skew between the first and second clock signals when selected.

3. The apparatus of claim 1, wherein the second feedback path is operative to introduce a desired degree of skew between the first and second clock signals when selected.

4. The apparatus of claim 1, wherein said first delay-inducing element comprises a clock tree.

5. The apparatus of claim 1, wherein said one or more additional delay-inducing elements comprise a plurality of buffers.

6. The apparatus of claim 5, further comprising:

a phase-locked loop (PLL) including a PLL input node; and a first buffer between the input node and the PLL input node, wherein said first feedback path comprises a first delay-inducing element and a second delay-inducing element operative to provide a delay sufficient to correct for a delay introduced by the first buffer in the output signal.

7. Apparatus comprising:

an input node operative to receive an input signal;

an output node operative to receive an output signal;

a clock signal path between the input node and the output node, said clock signal path including a clock tree;

a phase-locked loop circuit including
 a first feedback path including the clock tree, and
 a second feedback path including a string of buffers; and a mode selector operative to select the first feedback path in a first operating mode and to select the second feedback path in a second operating mode, wherein the first operating mode has a clocking scheme requiring substantially no skew between said input and output signals, and wherein the second operating mode has a clocking scheme requiring a degree of skew between said input and output signals.

8. Apparatus comprising:

an input node operative to receive an input signal;

an output node operative to receive an output signal;

a clock signal path between the input node and the output node, said clock signal path including a clock tree;

a phase-locked loop circuit including
 a first feedback path including the clock tree, and
 a second feedback path including a string of buffers; and a mode selector operative to select the first feedback path in a first operating mode and to select the second feedback path in a second operating mode, wherein the second feedback path includes the clock tree.

9. Apparatus comprising:

an input node operative to receive an input signal;

an output node operative to receive an output signal;

a clock signal path between the input node and the output node, said clock signal path including a clock tree;

a phase-locked loop circuit including
 a first feedback path including the clock tree, and
 a second feedback path including a string of buffers; and a mode selector operative to select the first feedback path in a first operating mode and to select the second feedback path in a second operating mode, wherein the phase-locked loop (PLL) circuit includes a PLL input node, and further comprising a delay-inducing element between the input node and the PLL input node.

10. The apparatus of claim 9, wherein the first feedback path further comprises a second delay-inducing element operative to introduce a delay sufficient to correct for a delay between the input node and the PLL input node caused by the first delay-inducing element.

* * * * *